US012365483B2

(12) United States Patent
Jha et al.

(10) Patent No.: US 12,365,483 B2
(45) Date of Patent: Jul. 22, 2025

(54) AIRCRAFT LIGHT, AIRCRAFT COMPRISING AN AIRCRAFT LIGHT, AND METHOD OF ASSEMBLING AN AIRCRAFT LIGHT

(71) Applicant: Goodrich Lighting Systems GmbH & Co. KG, Lippstadt (DE)

(72) Inventors: Anil Kumar Jha, Lippstadt (DE); Elmar Schrewe, Anröchte (DE); Jens Leuschner, Möhnesee (DE); Jennifer Krenn, Salzkotten (DE)

(73) Assignee: Goodrich Lighting Systems GmbH & Co. KG, Lippstadt (DE)

( * ) Notice: Subject to any disclaimer, the term of this patent is extended or adjusted under 35 U.S.C. 154(b) by 0 days.

(21) Appl. No.: 18/796,802

(22) Filed: Aug. 7, 2024

(65) Prior Publication Data
US 2025/0058893 A1 Feb. 20, 2025

(30) Foreign Application Priority Data
Aug. 16, 2023 (EP) .................................. 23191638.8

(51) Int. Cl.
*B64D 47/02* (2006.01)
*B64D 11/00* (2006.01)
(Continued)

(52) U.S. Cl.
CPC ............ *B64D 47/02* (2013.01); *F21V 23/006* (2013.01); *B64D 2011/0038* (2013.01); *B64D 2011/0053* (2013.01); *H05K 3/366* (2013.01)

(58) Field of Classification Search
CPC ........ B64D 47/02; B64D 47/04; B64D 47/06; B64D 2011/0038; B64D 2011/0053; F21V 23/006; H05K 3/366
See application file for complete search history.

(56) References Cited

U.S. PATENT DOCUMENTS

| 5,629,839 A | * | 5/1997 | Woychik ................ | H05K 3/366 439/55 |
| 5,754,411 A | * | 5/1998 | Woychik ................ | H05K 3/366 361/784 |

(Continued)

FOREIGN PATENT DOCUMENTS

| CA | 2835561 | 6/2015 |
| WO | 2014089897 | 6/2014 |

OTHER PUBLICATIONS

European Patent Office; European Search Report dated Jan. 9, 2024 in Application No. 23191638.8.

*Primary Examiner* — Alexander K Garlen
(74) *Attorney, Agent, or Firm* — SNELL & WILMER L.L.P.

(57) ABSTRACT

An aircraft light includes a light source support board; at least one light source, arranged on a light source side of the light source support board, the at least one light source being arranged to provide an aircraft light output of the aircraft light; a light transmission opening through the light source sup-port board, the light transmission opening extending between the light source side of the light source support board and a back side of the light source support board; an electronics accommodation space on the back side of the light source support board; a first auxiliary support board, arranged in the electronics accommodation space; a second auxiliary support board, arranged in the electronics accommodation space; and an opto-electronic component, arranged on the second auxiliary support board and oriented towards the light transmission opening.

14 Claims, 7 Drawing Sheets

(51) Int. Cl.
*F21V 23/00* (2015.01)
*H05K 3/36* (2006.01)

(56) References Cited

U.S. PATENT DOCUMENTS

| | | | |
|---|---|---|---|
| 7,354,274 | B2 | 4/2008 | Minich |
| 9,534,773 | B1* | 1/2017 | Turudic ............... H02H 3/26 |
| 10,355,383 | B2 | 7/2019 | Consoli et al. |
| 2002/0071259 | A1 | 6/2002 | Roos |
| 2009/0135595 | A1* | 5/2009 | Chen ................. F21K 9/232 |
| | | | 362/249.02 |
| 2020/0077525 | A1 | 3/2020 | Rietsch et al. |
| 2021/0122494 | A1 | 4/2021 | Hessling-Von Heimendahl et al. |
| 2022/0221141 | A1 | 7/2022 | Heimendahl et al. |

* cited by examiner

AIRCRAFT LIGHT, AIRCRAFT COMPRISING AN AIRCRAFT LIGHT, AND METHOD OF ASSEMBLING AN AIRCRAFT LIGHT

CROSS-REFERENCE TO RELATED APPLICATIONS

This application claims priority to and the benefit of EP Patent Application No. 23191638.8, filed Aug. 16, 2023 and titled "AIRCRAFT LIGHT, AIRCRAFT COMPRISING AN AIRCRAFT LIGHT, AND METHOD OF ASSEMBLING AN AIRCRAFT LIGHT," which is incorporated by reference herein in its entirety for all purposes.

FIELD

The present invention relates to aircraft lighting. In particular, the present invention relates to an aircraft light. The present invention further relates to an aircraft comprising such an aircraft light and to a method of assembling an aircraft light.

BACKGROUND

Almost all aircraft are equipped with numerous lights, including exterior aircraft lights and interior aircraft lights. In particular, large passenger airplanes are provided with a wide variety of exterior and interior aircraft lights.

Exterior aircraft lights are employed for a wide variety of different purposes, such as for allowing the passengers and/or air crew to view the outside, for passive visibility, for signaling purposes, etc. Examples of such exterior light units are navigation lights, also referred to as position lights, red-flashing beacon lights, white strobe anti-collision lights, wing scan lights, engine scan lights, take-off lights, landing lights, taxi lights, runway turn-off lights, etc.

Passenger aircraft, such as commercial airplanes, which comprise a passenger cabin with passenger seats, are usually equipped with general passenger cabin lights for illuminating the passenger cabin and washroom illumination lights for illuminating washrooms. Such passenger aircraft are usually further equipped with a plurality of individually switchable passenger reading lights and a plurality of individually switchable signal lights. All of these lights are examples of interior aircraft lights.

Some modern aircraft lights have ancillary functions in addition to the primary lighting functionality. For example, some aircraft lights have health monitoring capabilities, implemented via one or more light sensors. As another example, some aircraft lights communicate to the outside environment, i.e. to maintenance personnel and/or maintenance tools, with said communication for example taking place via wireless communication and/or via optical communication, such as via one or more status indicating auxiliary light sources. The integration of primary lighting functionality and ancillary functions may not always be satisfactory.

Accordingly, it would be beneficial to provide an aircraft light that has a beneficial framework for integrating the primary lighting functionality and one or more ancillary functions. It would also be beneficial to provide an aircraft equipped with such aircraft light and a method of assembling such an aircraft light.

SUMMARY

Exemplary embodiments of the invention include an aircraft light comprising a light source support board and at least one light source, which is arranged on a light source side of the light source support board. The at least one light source is arranged to provide an aircraft light output of the aircraft light. A light transmission opening extends through the light source support board. The light transmission opening extends in particular between the light source side of the light source support board and a back side of the light source support board. The light transmission opening may allow light to pass through the light source support board.

The aircraft light further comprises: an electronics accommodation space, which is located on the back side of the light source support board; a first auxiliary support board and a second auxiliary support board, which are arranged in the electronics accommodation space; and an opto-electronic component, which is arranged on the second auxiliary support board and which is oriented towards the light transmission opening. The first auxiliary support board and the second auxiliary support board are mechanically coupled, forming an X-shaped support board assembly.

Exemplary embodiments of the invention also include a method of assembling an aircraft light, wherein the method includes: providing a light source support board with at least one light source on a light source side of the light source support board and with a light transmission opening extending through the light source support board, the light transmission opening extending between the light source side of the light source support board and a back side of the light source support side. The method further includes arranging an X-shaped support board assembly, comprising a first auxiliary support board and a second auxiliary support board, in an electronics accommodation space on the back side of the light source support side. An opto-electronic component is arranged on the second auxiliary support board. The opto-electronic component is oriented towards the light transmission opening.

Exemplary embodiments of the invention allow for a highly functional, highly integrated, and highly flexible architecture of the aircraft light. With the opto-electronic component being arranged on the back side of the light source support board and being oriented towards the light transmission opening, it is well-positioned for providing its functionality in a highly undisturbed environment. The light transmission opening may help to keep the level of ambient light at the opto-electronic component low. In this way, in case the opto-electronic component is a light sensor, the light sensing may be much less affected by ambient light, as compared to previous approaches, where the light sensor was placed on the light source support board. Also, in case the opto-electronic component is an auxiliary light source, such as a status indicating auxiliary light source, the arrangement of the status indicating auxiliary light source behind the light transmission opening may help to have the status indicating visual sign at a clearly marked and easily discernible location. With the first auxiliary support board and the second auxiliary support board being arranged in an X-shaped support board assembly, electronic components of the aircraft light may be conveniently distributed among the first auxiliary support board and the second auxiliary support board. A comparably large amount of support board space may be provided, and the individual components may be placed in accordance with individual component preferences, such as component orientations, cooling needs, etc. Also, the X-shaped support board assembly may provide inherent stability to the first and second auxiliary support boards and may help in mounting the first and second auxiliary support boards to a support structure of the aircraft light. For example, it may be sufficient to mount the X-shaped support board assembly to the support structure of the aircraft light via only one of the first auxiliary support board and the second auxiliary support board. The other one of the first auxiliary support board and the second auxiliary support board may then be held/supported by said one of the first and second auxiliary support boards.

The first auxiliary support board and the second auxiliary support board are arranged in the electronics accommodation space on the back side of the light source support board. This may allow for reducing potential electromagnetic interference between the opto-electronic component and other components, arranged on the first and second auxiliary support boards, and the outside of the electronics accommodation space. In particular, electromagnetic interference between the electronic components in the electronics accommodation space and the at least one light source and, potentially, other components on the light source side of the light source support board may be kept low. Also, the electronic components in the electronics accommodation space may be shielded well from electromagnetic interference with respect to other electric components in the aircraft.

In an embodiment, the second auxiliary support board is supported by the first auxiliary support board. The first auxiliary support board may support further electronic components. The X-shaped support board assembly as a whole may then be supported with respect to the remainder of the aircraft light via the first auxiliary support board only. As a result, an aircraft light according to an exemplary embodiment of the invention may be manufactured with comparably few mounting means, such as comparably few mounting brackets, and may be manufactured at comparably low costs.

In an embodiment, the first auxiliary support board is supported by the second auxiliary support board. The first auxiliary support board may support further electronic components. The X-shaped support board assembly as a whole may then be supported with respect to the remainder of the aircraft light via the second auxiliary support board only. As a result, an aircraft light according to an exemplary embodiment of the invention may be manufactured with comparably few mounting means, such as comparably few mounting brackets, and may be manufactured at comparably low costs.

In an embodiment, the first auxiliary support board and the second auxiliary support board are arranged substantially perpendicular to each other. The angle between the first auxiliary support board and the second auxiliary support board may in particular be in the range of between 80° and 100°. More particularly, the angle between the first auxiliary support board and the second auxiliary support board may be in the range of between 85° and 95°. When being arranged substantially perpendicular/orthogonal to each other, the first auxiliary support board and the second auxiliary support board may form a support board assembly with a particularly good inherent stability.

In an embodiment, the first auxiliary support board is oriented substantially perpendicular to the light source support board and/or the second auxiliary support board is oriented substantially parallel to the light source support board.

The first auxiliary support board may in particular be oriented at an angle of between 80° and 100°, in particular at an angle of between 85° and 95°, with respect to the light source support board. The second auxiliary support board may in particular be oriented at an angle of between −10° to +10°, in particular at an angle of between −5° to +5°, with respect to the light source support board.

Arranging the second auxiliary support board substantially parallel to the light source support board may allow for the opto-electronic component to have a particularly good position/orientation with respect to the light source support board and the light transmission opening.

Arranging the first auxiliary support board substantially perpendicular/orthogonal to the light source support board may allow for the components on the first auxiliary support board to have particularly good positions in terms of cooling. In particular, the components on the first auxiliary support board may be spread out and spread away from the light source support board, allowing for an easier dissipation of heat.

In an embodiment, a coupling slit is formed in the first auxiliary support board and a corresponding engagement portion of the second auxiliary support board is introduced and positioned in said first coupling slit.

In an embodiment, a coupling slit is formed in the second auxiliary support board and a corresponding engagement portion of the first auxiliary support board is introduced and positioned in said second coupling slit.

Providing a coupling slit in at least one of the first and second auxiliary support boards for receiving a corresponding engagement portion of the other one of the first and second auxiliary support boards may allow for an effective, reliable, and space saving mechanical coupling between the first and second auxiliary support boards. Also, providing a coupling slit in at least one of the first and second auxiliary support boards for receiving a corresponding engagement portion of the other one of the first and second auxiliary support boards may allow for a straightforward implementation of the X-shaped support board assembly. Machining may be employed for forming the coupling slit within the respective auxiliary support board.

In an embodiment, the first auxiliary support board comprises a first coupling slit and a first engagement portion; and the second auxiliary support board comprises a second coupling slit and a second engagement portion. The first engagement portion may be introduced into the second coupling slit and the second engagement portion may be introduced in the first coupling slit, so that the first engagement portion is positioned in the second coupling slit and the second engagement portion is positioned in the first coupling slit, respectively.

Such a configuration may allow for a very effective mechanical coupling between the first and second auxiliary support boards. Providing a coupling slit in each of the two auxiliary support boards may in particular allow for mechanically coupling the two auxiliary support boards in a compact and space saving configuration, in particular in a configuration, in which the peripheral edges of the two auxiliary support boards are flush with each other.

In an embodiment, the first coupling slit and the second coupling slit are aligned in the X-shaped support board assembly at the intersection of the first auxiliary support board and the second auxiliary support board. The first coupling slit and the second coupling slit may in particular extend along a common line, extending along the intersection of the first auxiliary support board and the second auxiliary support board.

In an embodiment, the first auxiliary support board comprises a first electric interface area, and the second auxiliary support board comprises a second electric interface area. The first and second electric interface areas may be in electrical contact with each other, when the first and second auxiliary support boards are coupled with each other, forming the X-shaped support board assembly.

Providing first and second electric interface areas on the first and second auxiliary support boards may allow for electrically coupling the first and second auxiliary support boards with each other for transferring electric energy and/or electric signals, representing communication data, between the first and second auxiliary support boards.

The first electric interface area and the second electric interface area may comprise one or more electric contacts, respectively. The first electric interface area and the second electric interface area may in particular comprise the same number of electric contacts. In such a configuration, each electric contact of the first electric interface area may contact a corresponding electric contact of the second electric interface area, when the first and second auxiliary support boards are coupled with each other, forming the X-shaped support board assembly.

In an embodiment, the first auxiliary support board comprises first conductive traces, which are electrically coupled to the first electric interface area, and/or the second auxiliary support board comprises second conductive traces, which are electrically coupled to the second electric contact area. Conductive traces may allow for transferring electric power and/or electric signals between the electronic components, provided on the respective auxiliary support board, and the respective electric contact(s).

In an embodiment, the first auxiliary support board comprises a first elastic portion and the first electric interface area is formed on said first elastic portion. Alternatively or additionally, the second auxiliary support board may comprise a second elastic portion and the second electric interface area may be formed on the second elastic portion. In a particular embodiment, only the second auxiliary support board comprises such elastic portion, on which the second electric interface area is formed, but the first auxiliary support board is not equipped with an elastic portion.

Providing at least one elastic portion and forming at least one of the electric interface areas on said at least one elastic portion may allow for improving the electric coupling between the first and second electric interface areas. The elasticity may provide more flexibility in aligning the contacts between the first and second electric interface areas and may result in a more reliable electric connection between the first and second auxiliary support boards, in particular when the aircraft light including the first and second auxiliary support boards is moved, in particular accelerated, decelerated and/or vibrated.

In an embodiment, the first auxiliary support board comprises a first auxiliary slit, extending along the first elastic portion. The first coupling slit and the first auxiliary slit may in particular constitute a first slit arrangement that extends around the first elastic portion. In other words, the first elastic portion may be arranged between the first coupling slit and the first auxiliary slit.

In an embodiment, the second auxiliary support board comprises a second auxiliary slit, extending along the second elastic portion. The second coupling slit and the second auxiliary slit may in particular constitute a second slit arrangement that extends around the second elastic portion. In other words, the second elastic portion may be arranged between the second coupling slit and the second auxiliary slit.

In a particular embodiment, only the second auxiliary support board comprises a second elastic portion, which is arranged between the second coupling slit and a second auxiliary slit, but neither an elastic portion nor an auxiliary slit are formed at the first auxiliary support board.

An auxiliary slit, which is formed within the respective auxiliary support board next to the coupling slit for forming an elastic portion between the auxiliary slit and the coupling slit, May provide for a convenient way of forming an elastic portion at low costs. The auxiliary slit may, for example, be formed within the auxiliary support board by machining.

In an embodiment, the width the first coupling slit is slightly larger than the thickness of the second auxiliary support board. Additionally or alternatively, the width of the second coupling slit may be slightly larger than the thickness of the first auxiliary support board. Such a configuration may allow for introducing the engagement portion(s) of the auxiliary support board(s) into the corresponding coupling slit(s) of the respectively other auxiliary support board(s) and may allow for providing a reliable mechanical coupling between the first and second auxiliary support boards.

The first coupling slit, which is formed within the first auxiliary support board, may have a first width, which is between 0.2 mm and 0.5 mm larger than the thickness of the second auxiliary support board.

The second coupling slit, which is formed within the second auxiliary support board, may have a second width, which is in the range of between 0.2 mm and 0.5 mm larger than the thickness of the first auxiliary support board.

In an embodiment, the first auxiliary support board has a first thickness and the second auxiliary support board has a second thickness, wherein the first and second thicknesses are in the range of between 1.0 mm and 2.5 mm, in particular in the range of between 1.5 mm and 2.0 mm.

Such dimensions have been found as well-suited for providing a mechanically stable X-shaped support board assembly, when the first and second auxiliary support boards are coupled with each other.

In an embodiment, the opto-electronic component comprises a light sensor. The light sensor may be configured for detecting light emitted by the at least one light source. The light sensor may in particular detect light emitted by the at least one light source and directed through the light transmission opening. The directing through the light transmission opening may be affected by a light transmissive cover of the aircraft light and/or by a light guiding assembly and/or in another suitable manner. Alternatively or additionally, the light sensor may be configured for detecting ambient light. The opto-electronic component may also comprise a first light sensor for detecting light, emitted by the at least one light source, and a second light sensor for detecting ambient light.

Providing the aircraft light with a light sensor may allow for operating the at least one light source of the aircraft light depending on the light detected by the light sensor. By detecting light, emitted by the at least one light source, the operational state as well as the health status of the at least one light source may be monitored. The at least one light source may then be operated depending on this information. The at least one light source may also be operated depending on detected ambient light.

Additionally or alternatively, providing the aircraft light with a light sensor may allow for determining and, potentially, indicating a health status of the aircraft light. For example, from the output of the light sensor, an aging state of the at least one light source and/or a level of erosion of the light transmissive cover of the aircraft light may be determined. The determined health status of the aircraft light may be indicated to one or more entities outside of the aircraft light, such as to maintenance personnel and/or to a maintenance tool and/or to a board computer of the aircraft. This communication may be carried out via a wired or wireless communication channel and/or in a visual manner, such as via one or more status indicating auxiliary light sources. In this way, a particularly targeted maintenance and/or replacement of the aircraft light may be achieved.

In a further embodiment, the opto-electronic component comprises an auxiliary light source, such as a status indicating auxiliary light source, which may allow maintenance personnel to monitor an operational status of the at least one light source and/or another operational parameter of the aircraft light.

In an embodiment, at least one of aircraft light power circuitry, aircraft light control circuitry, and light sensor output evaluation circuitry for evaluating the output of the light sensor is arranged on the first auxiliary support board. As mentioned, electric power and/or electric data signals may be transmitted between circuitry, provided on the first auxiliary support board, and the opto-electronic component, provided on the second auxiliary support board. Said transmission may take place via the electric interface, which is constituted by the first and second electric interface areas formed on the first and second auxiliary support boards.

The first auxiliary support board may in particular support circuitry configured for supplying power to the at least one light source and/or for controlling the at least one light source, which is provided on the light source support board. In other words, the first auxiliary support board may support one or more components, provided for the primary lighting functionality of the aircraft light.

In an embodiment, the aircraft light comprises a housing and a support structure for supporting the light source support board, the first auxiliary support board and the second auxiliary support board. The aircraft light, in particular the support structure thereof, may be provided with at least one cooling rib for dissipating heat, which is generated when the aircraft light is operated.

In an embodiment, the aircraft light comprises an at least partially light transmissive cover, which allows for light, emitted by the at least one light source, to pass through and exit the housing for providing the aircraft light output of the aircraft light.

In an embodiment, the aircraft light comprises at least one optical component, such as one or more lenses and/or one or more reflectors and/or one or more shutters, for forming the aircraft light output from the light emitted by the at least one light source. The at least one optical component may be arranged between the light source support board and the light transmissive cover, in particular between the at least one light source and the light transmissive cover. The at least partially light transmissive cover may also have an optical effect in forming the aircraft light output and may be referred to as a lens cover.

In an embodiment, the aircraft light is an exterior aircraft light. The aircraft light may in particular be a red-flashing anti-collision beacon light, a white anti-collision strobe light, a landing light, a take-off light, a taxi light, a runway turn-off light, a navigation light, a logo light, a wing scan light, an engine scan light, a cargo loading light, or a multi-functional exterior aircraft light, which combines the functionalities of at least two of a red-flashing anti-collision beacon light, a white anti-collision strobe light, a landing light, a take-off light, a taxi light, a runway turn-off light, a navigation light, a logo light, a wing scan light, an engine scan light, and a cargo loading light.

In an embodiment, the aircraft light is an interior aircraft light. The aircraft light may in particular be a passenger reading light, a cabin illumination light, a washroom illumination light, a signal light, an emergency light, or an exit light.

Exemplary embodiments of the invention further include an aircraft, such as an airplane or a helicopter, which is equipped with at least one aircraft light according to an exemplary embodiment of the invention. The additional features, modifications and effects, as described above with respect to an aircraft light and/or with respect to a method of assembling an aircraft light, apply to the aircraft in an analogous manner.

BRIEF DESCRIPTION OF THE DRAWINGS

Further exemplary embodiments of the invention are described below with respect to the accompanying drawings, wherein.

DETAILED DESCRIPTION

Figure 1A:
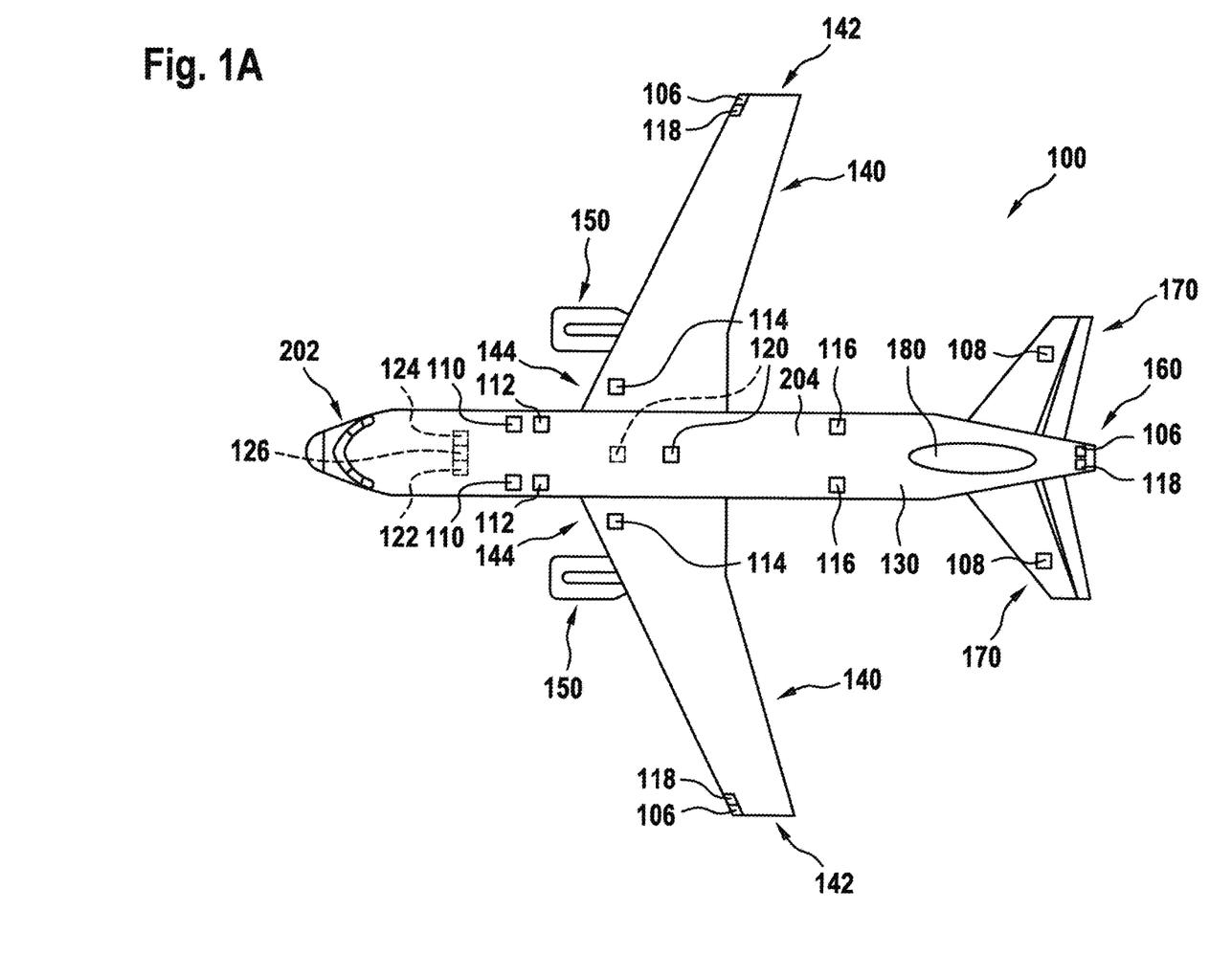
FIG. 1A shows a schematic top view of an aircraft, which is equipped with a variety of exterior aircraft lights.
Figure 1B:
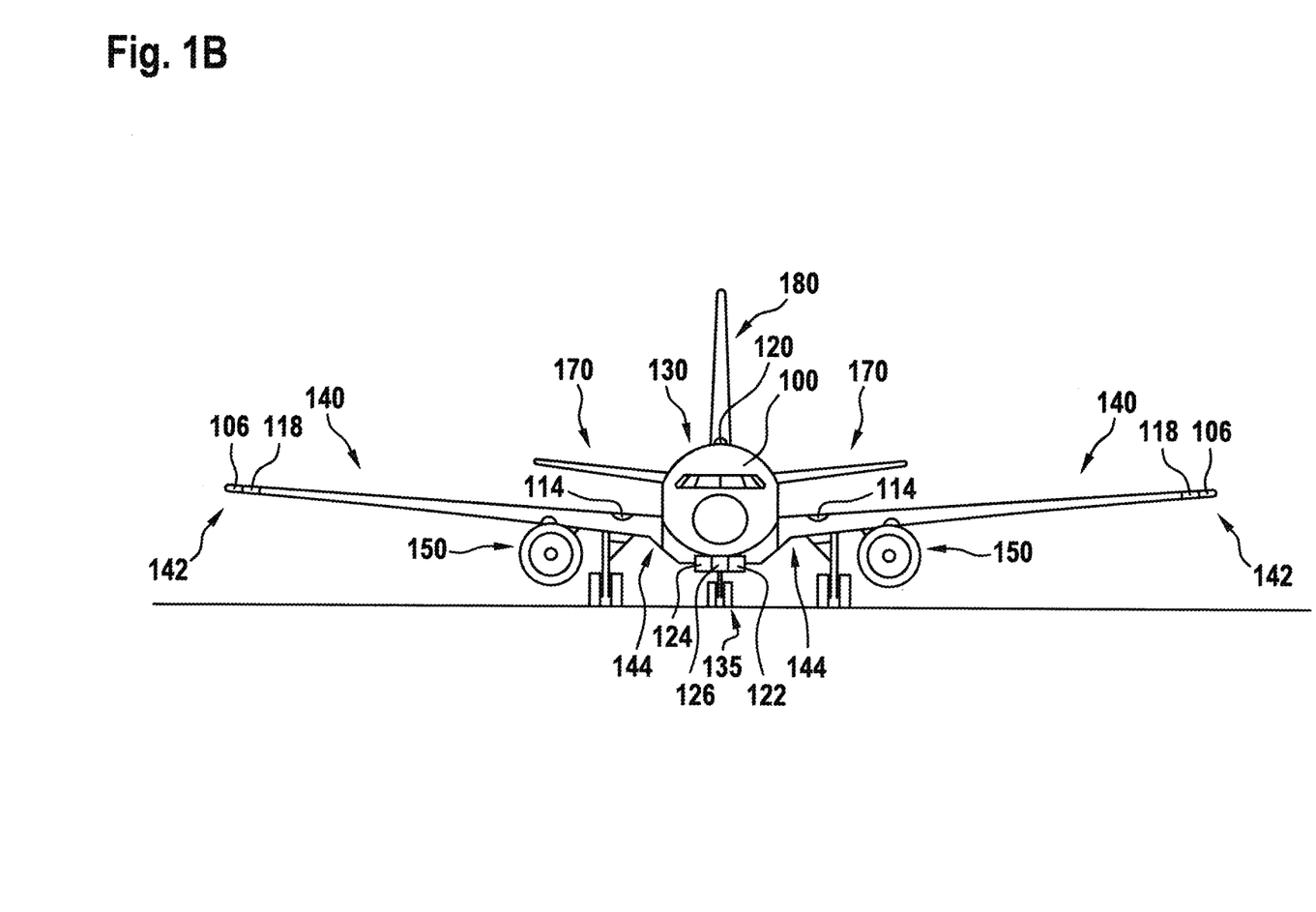
FIG. 1B shows a schematic front view of the aircraft shown in FIG. 1A.

FIGS. 1A and 1B, jointly referred to as FIG. 1 herein, show an aircraft 100, in particular an airplane, comprising a fuselage 130, which houses a cockpit 202 and a passenger cabin 204, and two wings 140, extending from the fuselage 130. Two horizontal stabilizers 170 and a vertical stabilizer 180 extend from a rear portion of the fuselage 130. An engine 150 is mounted to each of the wings 140, respectively. The aircraft 100 is shown in a top view in FIG. 1A and shown in a front view in FIG. 1B.

The aircraft 100 of FIG. 1 is equipped with a wide variety of exterior lights. In particular, the aircraft 100 is equipped with three navigation lights 106, two logo lights 108, two wing scan lights 110, two engine scan lights 112, two runway turn-off lights 114, two cargo loading lights 116, three white anti-collision strobe lights 118, two red-flashing anti-collision beacon lights 120, a landing light 122, a take-off light 124, and a taxi light 126. It is pointed out that these kinds of lights and their numbers are exemplary only and that the aircraft 100 may be equipped with additional lights that are not shown.

The three navigation lights 106 are positioned in the left and right wing tips 142 as well as at the tail 160 of the aircraft 100. In normal flight conditions, each one of the navigation lights 106 emits light in one of the colors green, red and white, thus indicating to the aircraft environment if they are looking at the port side, starboard side or tail side of the aircraft. The navigation lights 106 are normally on during all phases of the flight and in all flight conditions.

The logo lights 108 are directed to the vertical stabilizer 180 of the aircraft 100 and are provided for illuminating the same, in particular for illuminating the logo commonly provided on the vertical stabilizer 180. The logo lights 108 are normally switched on for the entire duration of the flight during night flights. It is also possible that the logo lights are only used during taxiing on the airport and are normally switched off during the flight.

The wing scan lights 110 and the engine scan lights 112 are positioned on the left and right sides of the fuselage 130, in front of the roots 144 of the wings 140 of the aircraft 100. The wing scan lights 110 and the engine scan lights 112 are normally off during the flight and may be switched on periodically or upon reasonable cause by the pilots or by the aircrew, in order to check the wings 140 and the engines 150 of the aircraft 100.

The runway turn-off lights 114 are positioned in the roots 144 of the wings 140. The runway turn-off lights 114 are directed forwards and are normally switched off during the flight and switched on during taxiing, at least at night.

The cargo loading lights 116 are positioned on the left and right sides of the fuselage 130, behind the wings 140 and in front of the tail structure of the aircraft 100. They are normally switched off during the flight of the aircraft 100.

The white anti-collision strobe lights 118 are positioned in the left and right wing tips 142 as well as at the tail 160 of the aircraft 100. The white anti-collision strobe lights 118 emit respective sequences of white light flashes during normal operation of the aircraft 100. It is also possible that the white anti-collision strobe lights 118 are only operated during night and in bad weather conditions.

The red-flashing anti-collision beacon lights 120 are positioned on the top and the bottom of the fuselage 130 of the aircraft 100. They are arranged at the height of the wings in the longitudinal direction of the aircraft 100. While one of the red-flashing anti-collision beacon lights 120 is disposed on the top of the fuselage 130, the other one of the red-flashing anti-collision beacon lights 120 is disposed on the bottom of the fuselage 130 and is therefore shown in phantom in FIG. 1A. The red-flashing anti-collision beacon lights 120 are normally switched on during taxiing and during take-off and landing. Their output is perceived as a sequence of red light flashes in a given viewing direction.

In the embodiment depicted in FIGS. 1A and 1B, the runway turn-off lights 114 are located in the wings 140, in particular in the roots 144 of the wings 140, and the landing light 122, the take-off light 124 and the taxi light 126 are mounted to the front gear 135 of the aircraft 100. The front gear 135 is stored within the fuselage 130 of the aircraft 100 during flight, and it is deployed during landing, taxiing and take off.

In alternative embodiments, which are not explicitly shown in the figures, the runway turn-off lights 114 may be mounted to the front gear 135 and/or at least one of the landing light 122, the take-off light 124 and the taxi light 126 may be installed in the wings 140, in particular in the roots 144 of the wings 140, of the aircraft 100.

The aircraft 100 may also comprise one or more multi-functional lights, which combine(s) the functionalities of at least two of a landing light, a take-off light, a taxi light, a runway turn-off light, a navigation light, a white strobe anti-collision light, and a red-flashing beacon light.

Since the landing light 122, the take-off light 124, and the taxi light 126 are arranged on the bottom of the aircraft 100, they are also depicted in phantom in FIG. 1A.

Each of these exterior aircraft lights may be an aircraft light according to an exemplary embodiment of the invention.

Figure 2:
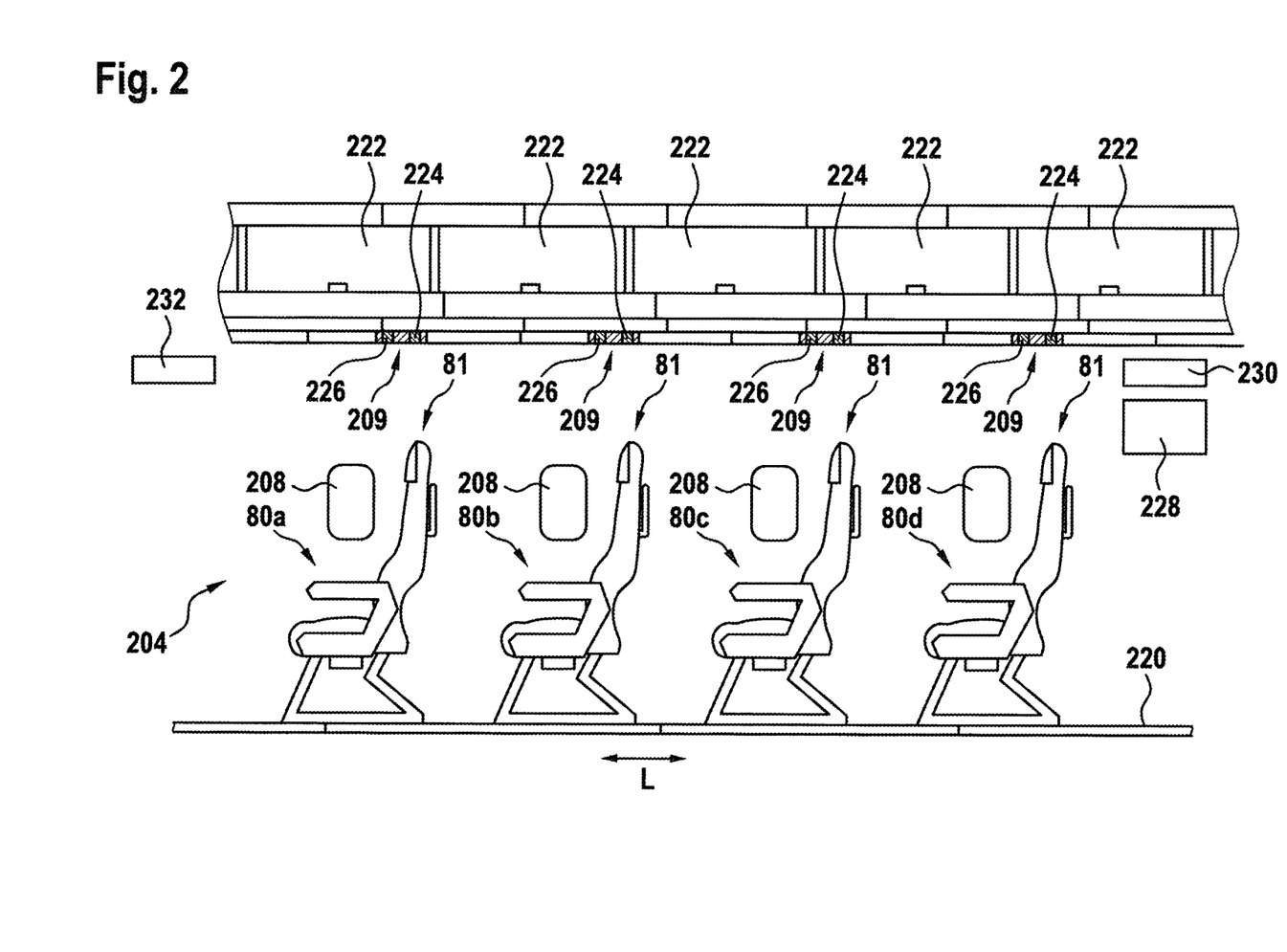
FIG. 2 shows a schematic longitudinal cross-sectional view of a section of the passenger cabin of the aircraft shown in FIGS. 1A and 1B.

FIG. 2 shows a schematic longitudinal cross-sectional view of a section of the passenger cabin 204 of the aircraft 100 shown in FIG. 1.

Four seats 81, which are also referred to as passenger seats 81, are visible in FIG. 2. The passenger seats 81 are mounted to a floor 220 of the passenger cabin 204. Each of the depicted passenger seats 81 belongs to a different seat row 80*a*-80*d*. The seat rows 80*a*-80*d* are spaced apart from each other along the longitudinal direction L of the passenger cabin 204.

For each of the seat rows 80*a*-80*d*, a window 208 is provided, which allows the passengers to view the outside of the aircraft 100. Further, a plurality of overhead baggage compartments 222, which provide storage space for the passengers' baggage, are provided above the passenger seats 81.

Each seat row 80*a*-80*d* may include a plurality of passenger seats 81, for example three passenger seats 81, which are arranged next to each other along a lateral direction, which is orthogonal to the longitudinal direction L. The additional passenger seats, i.e. the middle seat and the window seat, of each seat row 80*a*-80*d* are not visible in FIG. 2, as they are arranged behind and therefore hidden by the depicted aisle seats 81.

An aircraft overhead passenger service unit (PSU) 209 is provided above each of the seat rows 80*a*-80*d*, respectively.

Each of the aircraft overhead passenger service units 209 may comprise at least one interior aircraft light. Each of the aircraft overhead passenger service units 209 may, for example, comprise a plurality of passenger reading lights 224, wherein the light output of each of the passenger reading lights 224 is directed towards one of the passenger seats 81 arranged below the respective aircraft overhead passenger service unit 209. Each of the aircraft overhead passenger service units 209 may further comprise one or more signal lights 226, which may, for example, light up in case a request for the cabin service personnel has been triggered by a passenger or in case a passenger instruction, such as a fasten your seat belt symbol, is depicted to the passenger.

The passenger cabin 204 may further comprise at least one general cabin illumination light 228 for illuminating the passenger cabin 204, at least one emergency light 230 for providing illumination in an emergency situation, and/or at least one exit light 232 for indicating an emergency exit location and/or for illuminating an exit path out of the aircraft.

Each of these interior aircraft lights may be an aircraft light according to an exemplary embodiment of the invention.

Figure 3:
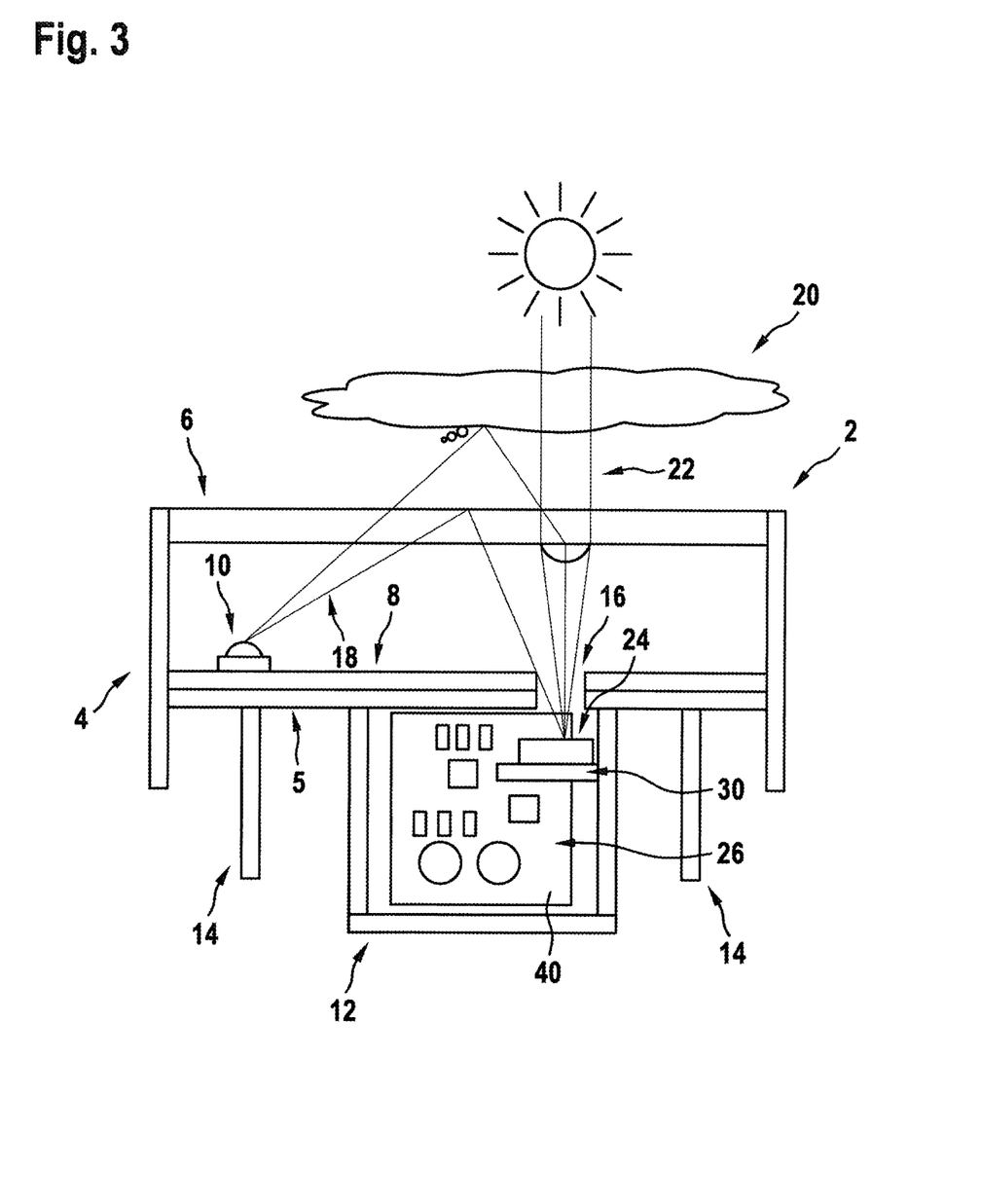
FIG. 3 shows a schematic cross-sectional view of an aircraft light according to an exemplary embodiment of the invention.

FIG. 3 depicts a schematic cross-sectional view of an aircraft light 2 according to an exemplary embodiment of the invention.

The aircraft light 2 comprises a housing 4 and an at least partially light transmissive cover 6. The at least partially light transmissive cover 6 may or may not include a cover lens.

The housing 4 comprises a support structure 5, supporting a light source support board 8. The light source support board 8 supports a light source 10. The light source 10 is arranged on a light source support side of the light source support board 8, facing the at least partially light transmissive cover 6. When activated, the light source 10 provides an aircraft light output of the aircraft light. The light source 10 may in particular be an LED.

The support structure 5 is provided with cooling ribs 14 for dissipating heat, which is generated when the aircraft light 2 is operated.

For simplicity of illustration, only a single light source 10 is depicted in FIG. 3, but the aircraft light 2 may also comprise a plurality of light sources. Further, for simplicity of operation, no optical system is depicted between the light source 10 and the at least partially light transmissive cover 6. It is understood that one or more lenses and/or one or more reflectors and/or one or more shutters may be arranged to transform the light output of the light source 10 into the aircraft light output of the aircraft light. The number of light sources, the kinds of optical elements, and the arrangement of the optical element(s) with respect to the light source(s) may be chosen depending on the desired aircraft light output, i.e. depending on the particular purpose of the aircraft light.

An electronics accommodation space 12 is formed on a back side of the light source support board 8, which is the side of the light source support board 8 opposite to the light source support side. The electronics accommodation space 12 may be enclosed by the support structure 5. For this purpose, the support structure 5 may have a plurality of surrounding walls for the electronics accommodation space 12, as it is depicted in FIG. 3. It can also be said that the portion of the support structure 5 underneath the light source support board 8 and the plurality of surrounding walls form an electronics accommodation housing. The plurality of surrounding walls may be—directly or indirectly—mounted to the portion of the support structure 5 underneath the light source support board 8.

A light transmission opening 16 is formed in the light source support board 8 and the support structure 5. The light transmission opening 16 is in particular formed in a portion of the light source support board 8 and the support structure 5, which is located over the electronics accommodation space 12. As a result, the light transmission opening 16 provides a light path between the electronics accommodation space 12 and the light source support side of the light source support board 8. The light path allows light to enter into the electronics accommodation space 12 from the light source support side of the light source support board 8.

The light entering into the electronics accommodation space 12 may include light emitted by the light source 10 and reflected by the light transmissive cover 6 and/or other objects 20, such as clouds or mist, located outside the aircraft light 2. Alternatively or additionally, the light entering into the electronics accommodation space 12 may include ambient light 22 from the environment, such as direct or indirect sun light. The aircraft light 2 of FIG. 3 may be a landing light, where ambient light and/or clouds play a role in the performance of the aircraft light. While the landing light scenario is an illustrative example for describing an embodiment of the present invention, it is stressed again that the present invention is applicable to various kinds of exterior aircraft lights and various kinds of interior aircraft lights, as described herein.

An opto-electronic component 24 is provided within the electronics accommodation space 12. The opto-electronic component 24 may in particular include a light sensor for detecting light that has entered into the electronics accommodation space 12.

Alternatively or additionally, the opto-electronic component 24 may comprise an auxiliary light source, for example as a status indicating auxiliary light source, which may be an LED.

Additional electronic components 26, in particular electronic components for evaluating an output provided by the opto-electronic component 24 and/or power circuitry for the opto-electronic component 24 and/or power circuitry for the light source 10 of the aircraft light 2 and/or control circuitry for the light source 10 of the aircraft light 2, may be arranged within the electronics accommodation space 12 as well.

In an aircraft light 2 according to an exemplary embodiment of the invention, two auxiliary support boards 40, 30 are provided within the electronics accommodation space 12 for supporting the opto-electronic component 24 and the additional electronic components 26. In particular, the aircraft light 2 comprises a first auxiliary support board 40 and a second auxiliary support board 30.

The second auxiliary support board 30, supporting the opto-electronic component 24, extends substantially parallel to the back side of the light source support board 8 within the electronics accommodation space 12. The second auxiliary support board 30 is in particular arranged in a position that allows the opto-electronic component 24, which is mounted to the second auxiliary support board 30, to detect light 18 emitted by the light source 10 and reflected by the at least partially light transmissive cover 6 and/or by an object 20, which is located in front of the aircraft light 2.

The first auxiliary support board 40, supporting additional electronic components 26, is mechanically coupled to the second auxiliary support board 30, such that the second auxiliary support board 30 and the first auxiliary support board 40 form an X-shaped auxiliary support board assembly.

In the embodiment depicted in FIG. 3, the first auxiliary support board 40 extends substantially perpendicular to the second auxiliary support board 30 and to the light source support board 8.

Figure 4A:
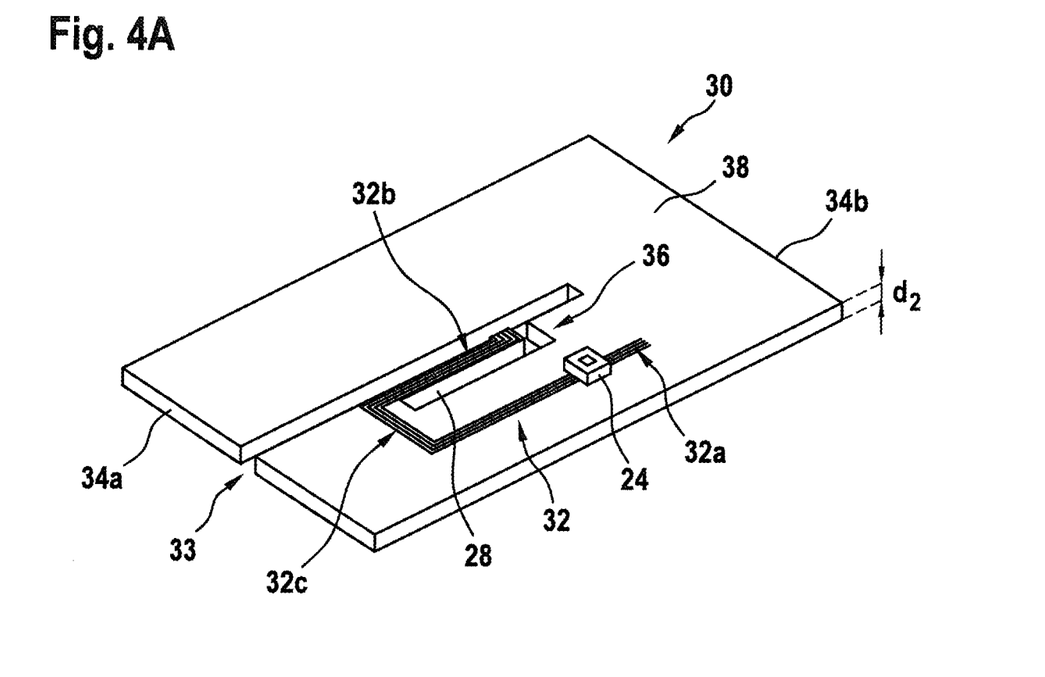
FIG. 4A shows a schematic perspective view of a second auxiliary support board of an aircraft light according to an exemplary embodiment of the invention.
Figure 4B:
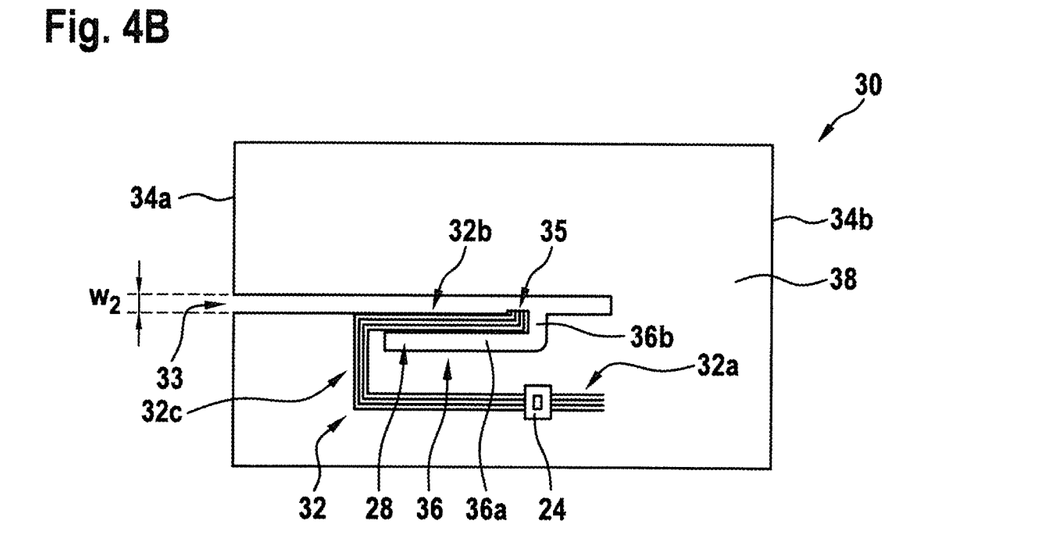
FIG. 4B shows a schematic top view of the second auxiliary support board depicted in FIG. 4A.

FIG. 4A shows a schematic perspective view of the second auxiliary support board 30 of an aircraft light 2 according to an exemplary embodiment of the invention, and FIG. 4B shows a schematic top view of said second auxiliary support board 30.

The second auxiliary support board 30 supports the opto-electronic component 24, as it has been described before. The second auxiliary support board 30 may additionally support further electronic components, which are not depicted in FIGS. 4A and 4B. The electronic components located on the second auxiliary support board 30 may be functionally related to the opto-electronic component 24.

A plurality of conductive traces 32 for electrically coupling the opto-electronic component 24, and potential further electronic components, are formed on the second auxiliary support board 30.

In the exemplary embodiment depicted in FIGS. 4A and 4B, the conductive traces 32 extends along a path, which has the form of a U and comprises two long legs 32a, 32b, extending basically parallel to each other, and a short leg 32c, extending perpendicular between the two long legs 32a, 32b.

The opto-electronic component 24 is arranged on and electrically coupled to a first long leg 32a of the two long legs 32a, 32b.

Two slits 33, 36 extend parallel to a second long leg 32b of the two long legs 32a, 32b. As a result, the second long leg 32b is basically sandwiched between the two slits 33, 36.

One of the two slits 33, 36 is denoted a second coupling slit 33, as will be described in more detail below, and extends straight from a first peripheral edge 34a of the second auxiliary support board 30 towards a central portion of the second auxiliary support board 30. The second coupling slit 33 is open at the first peripheral edge 34a of the second auxiliary support board 30.

The other slit 36 has the shape of an L, including a long leg 36a, which extends parallel to a portion of the second coupling slit 33, and a short leg 36b, which extends between the long leg 36a of the other slit 36 and the second coupling slit 33.

As a result, an elastic portion 28, in particular an elastic arm, is formed between the second coupling slit 33 and the other slit 36, which is also referred to as auxiliary slit 36 herein. The second long leg 32b of the conductive traces 32 extends on said elastic portion 28. The flexibility of the elastic portion 28 may be adjusted by varying the length of the auxiliary slit 36.

An area of the second auxiliary support board 30, which is located between the inner end of the second coupling slit 33 and an opposing second peripheral edge 34b of the second auxiliary support board 30 is denoted as a second engagement portion 38 for reasons which will become apparent further below.

A second electric interface area 35, comprising a plurality of electric contacts facing the second coupling slit 33, is formed at the free end of the elastic portion 28.

Figure 4C:
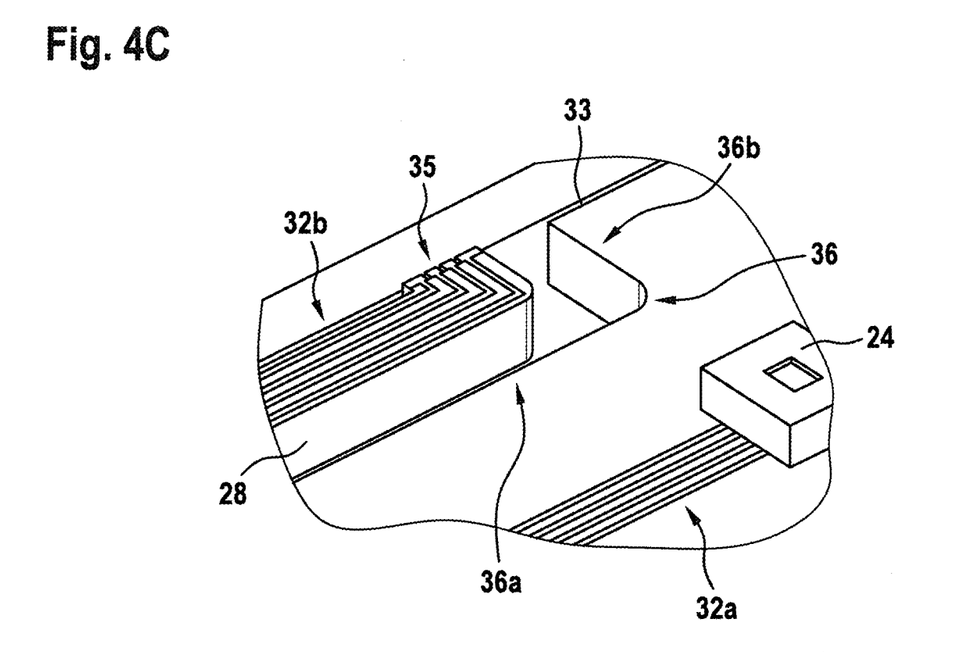
FIG. 4C shows an enlarged perspective view of an electric interface area of the second auxiliary support board depicted in FIG. 4A.

FIG. 4C shows an enlarged perspective view of the free end of the elastic portion 28 with the second long leg 32b of the conductive traces 32 and the second electric interface area 35.

Figure 5A:
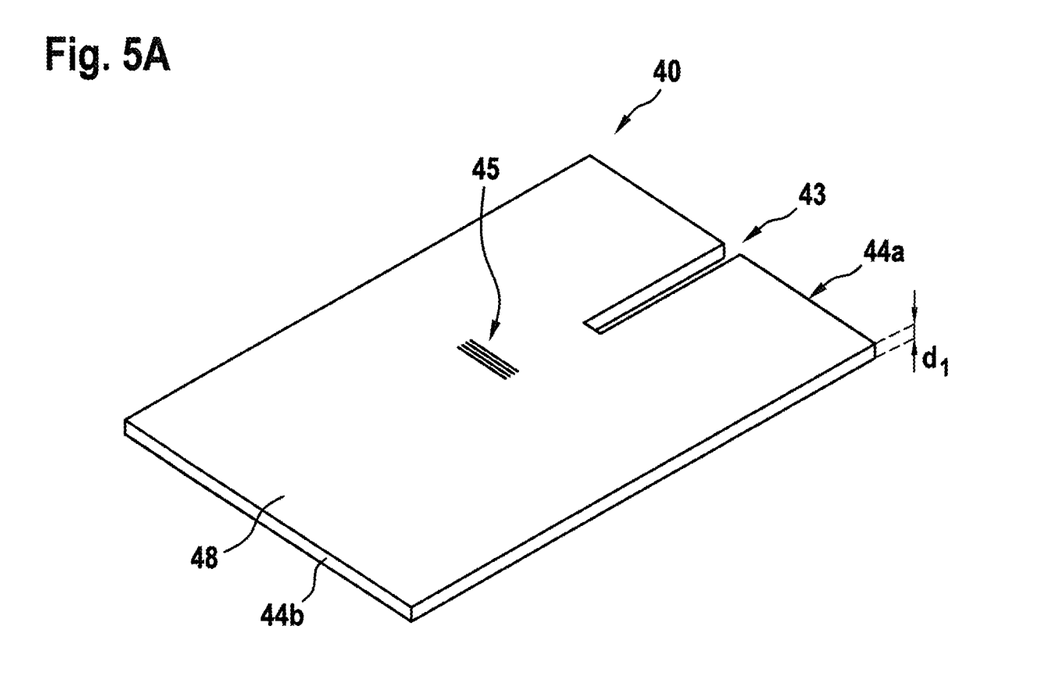
FIG. 5A shows a schematic perspective view of a first auxiliary support board of an aircraft light according to an exemplary embodiment of the invention.
Figure 5B:
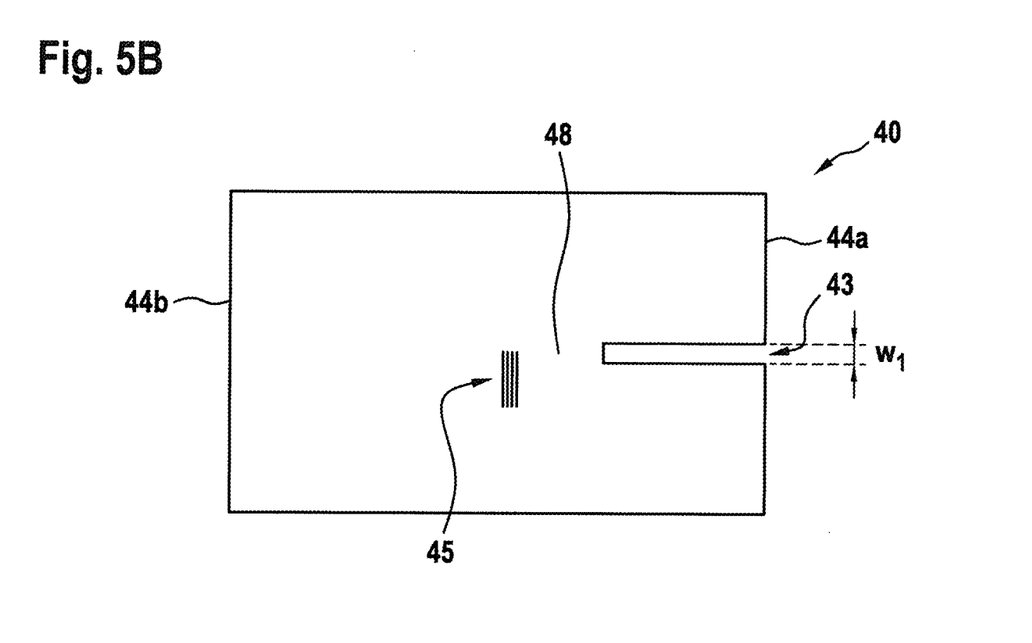
FIG. 5B shows a schematic top view of the first auxiliary support board depicted in FIG. 5A.

FIG. 5A shows a schematic perspective view of the first auxiliary support board 40 of an aircraft light 2 according to an exemplary embodiment of the invention, and FIG. 5B shows a schematic top view of said first auxiliary support board 40.

A first coupling slit 43 is formed within the first auxiliary support board 40. Similar to the second coupling slit formed in the second auxiliary support board 30, the first coupling slit 43 extends straight from a first peripheral edge 44a of the first auxiliary support board 40 towards a central portion of the first auxiliary support board 40. The first coupling slit 43 is open at the first peripheral edge 44a of the first auxiliary support board 40.

A first electric interface area 45 is formed on the first auxiliary support board 40.

Conductive traces, which are not shown in FIGS. 5A and 5B, may extend between the first electric interface area 45 and the electronic components 26 (see FIG. 3), which may be provided on the first auxiliary support board 40. Such electronic components 26 are not depicted in FIGS. 5A and 5B for clarity of illustration.

An area of the first auxiliary support board 40, which is located between the inner end of the first coupling slit 43 and an opposing second peripheral edge 44b of the first auxiliary support board 40, is denoted as a first engagement portion 48.

Figure 6:
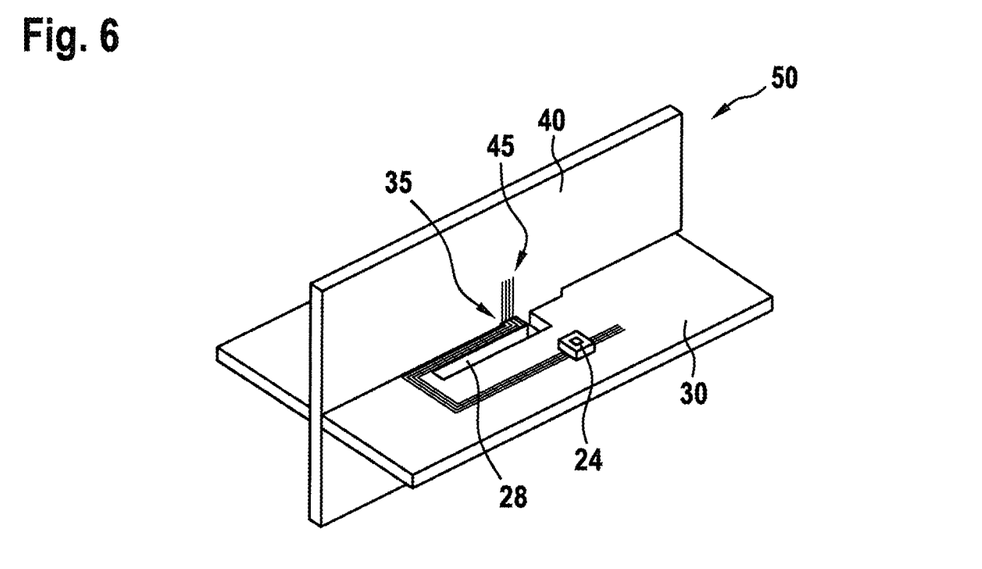
FIG. 6 shows a perspective view of an X-shaped support board assembly of an aircraft light according to an exemplary embodiment of the invention, the X-shaped support board assembly comprising the first auxiliary support board depicted in FIGS. 5A and 5B and the second auxiliary support board depicted in FIGS. 4A, 4B, and 4C.

FIG. 6 shows a perspective view of a configuration in which the first auxiliary support board 40 and the second auxiliary support board 30, as depicted in FIGS. 4 and 5, are mechanically coupled with each other, forming an X-shaped support board assembly 50.

In the X-shaped support board assembly 50 depicted in FIG. 6, the first engagement portion 48 of the first auxiliary support board 40 is arranged within the second coupling slit 33 formed within the second auxiliary support board 30; and the second engagement portion 38 of the second auxiliary support board 30 is arranged within the first coupling slit 43 formed within the first auxiliary support board 40. The first coupling slit 43 and the second coupling slit 33 are aligned with each other. The first coupling slit 43 and the second coupling slit 33 may in particular extend along a common line, which extends perpendicular to the peripheral edges 44a, 44b, 34a, 34b of the first and second auxiliary support boards 40, 30.

The length of the first coupling slit 43 and the length of the second coupling slit 33 are set such that the first peripheral edges 44a, 34a and the second peripheral edges 44b, 34b of the first and second auxiliary support boards 40, 30 are flush with each other.

The first coupling slit 43 and the second coupling slit 33 may, for example, extend over 50% of the length of first auxiliary support board 40 and the second auxiliary support board 30, respectively. Alternative configurations, in which the first coupling slit 43 and the second coupling slit 33 extend over 20%, 30%, 40%, 60%, 70% or 80% of the length of first auxiliary support board 40 and of the second auxiliary support board 30, respectively, are possible as well.

Further configurations, in particular configurations, in which the peripheral edges 44a, 44b, 34a, 34b are not flush with respect to each other, are possible as well. It is in particular possible, that a single coupling slit is formed in only one of the first and second auxiliary support boards 40, 30 and the other one of the first and second auxiliary support boards 40, 30, in which no coupling slit is formed, is introduced into said single coupling slit. In such a configuration, the peripheral edges of the first and second auxiliary support boards 40, 30 are not flush with respect to each other.

For providing a reliable mechanical coupling between the first auxiliary support board 40 and second auxiliary support board 30, the widths $w_1$, $w_2$, of the first and second coupling slits 43, 33 (see FIGS. 4B and 5B) may be set slightly larger than the thicknesses $d_1$, $d_2$ of the first and second auxiliary support boards 40, 30 (see FIGS. 4A and 5A), respectively.

When the first auxiliary support board 40 has a first thickness $d_1$, the second coupling slit 33 formed within the second auxiliary support board 30 may, for example, have a second width $w_2$, which is in the range of between 0.2 mm and 0.5 mm larger than the first thickness $d_1$ of the first auxiliary support board 40.

When the second auxiliary support board 30 has a second thickness $d_2$, the first coupling slit 43 formed within the first auxiliary support board 40 may, for example, have a first width $w_1$, which is in the range of between 0.2 mm and 0.5 mm larger than the second thickness $d_2$ of the second auxiliary support board 30.

The first thickness $d_1$ and the second thickness $d_2$ may, for example, be in the range of between 1.0 mm and 2.5 mm, more particularly in the range of between 1.5 mm and 2.0 mm.

In the X-shaped support board assembly 50 depicted in FIG. 6, the second electric interface area 35, which is formed at the free end of the elastic portion 28 of the second auxiliary support board 30 facing the second coupling slit 33, contacts the first electric interface area 45, which is formed on the first auxiliary support board 40, for providing an electric coupling between the first and second auxiliary support boards 40, 30.

Each of the first and second electric interface areas 45, 35 may comprise a plurality of electric contacts, respectively, with each of said electric contacts contacting a corresponding electric contact formed on the other auxiliary support board, when the first and second auxiliary support boards 40, 30 are arranged forming the X-shaped support board assembly 50, as it is depicted in FIG. 6.

The elastic portion 28, which is formed between the second coupling slit 33 and the auxiliary slit 36 of the second auxiliary support board 30, causes the second electric interface area 35, which is formed at the free end of the elastic portion 28, to be elastically pressed against the first electric interface area 45 of the first auxiliary support board 40. This may contribute to a particularly reliable electric coupling between the first and second electric interface areas 45, 35.

The X-shaped support board assembly 50 may be mounted to the housing around the electronics accommodation space 12, i.e. to the support structure 5 around the electronics accommodation space 12, via a single connection. In particular, as indicated in FIG. 3, it is possible that the second auxiliary support board 30 is mounted to a surrounding wall, extending substantially perpendicular to the light source support board 8, and that the second auxiliary support board 30 holds the first auxiliary support board 40. Conversely, it is possible that the first auxiliary support board 40 is mounted to the support structure 5, in particular to the portion of the support structure 5 underneath the light source support board 8 or to a surrounding wall that extends substantially perpendicular to the light source support board 8, and that the first auxiliary support board 40 holds the second auxiliary support board 30.

The X-shaped support board assembly 50, as depicted in FIG. 6, may be used in the embodiment depicted in FIG. 3.

While the invention has been described with reference to exemplary embodiments, it will be understood by those skilled in the art that various changes may be made and equivalents May be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed, but that the invention will include all embodiments falling within the scope of the appended claims.

The invention claimed is:

1. An aircraft light, comprising:
a light source support board;
at least one light source, arranged on a light source side of the light source support board, the at least one light source being arranged to provide an aircraft light output of the aircraft light;
a light transmission opening through the light source support board, the light transmission opening extending between the light source side of the light source support board and a back side of the light source support board;
an electronics accommodation space on the back side of the light source support board;
a first auxiliary support board, arranged in the electronics accommodation space;
a second auxiliary support board, arranged in the electronics accommodation space; and
an opto-electronic component, arranged on the second auxiliary support board and oriented towards the light transmission opening;
wherein the first auxiliary support board and the second auxiliary support board are mechanically coupled, forming an X-shaped support board assembly;
wherein the first auxiliary support board comprises a first electric interface area; wherein the second auxiliary support board comprises a second electric interface area; wherein the first and second electric interface areas are in electrical contact with each other; and wherein at least one of the first electric interface area and the second electric interface area is formed on a first elastic portion.

2. The aircraft light according to claim 1, wherein the first auxiliary support board and the second auxiliary support board are substantially orthogonal to each other.

3. The aircraft light according to claim 1,
wherein the first auxiliary support board is substantially orthogonal to the light source support board; and/or
wherein the second auxiliary support board is substantially parallel to the light source support board.

4. The aircraft light according to claim 1,
wherein one of the first auxiliary support board and the second auxiliary support board comprises a first coupling slit, and
wherein an engagement portion of the other one of the first auxiliary support board and the second auxiliary support board is positioned in the first coupling slit.

5. The aircraft light according to claim 1,
wherein the first auxiliary support board comprises a first coupling slit and a first engagement portion; and
wherein the second auxiliary support board comprises a second coupling slit; and a second engagement portion;
wherein the first engagement portion is positioned in the second coupling slit; and
wherein the second engagement portion is positioned in the first coupling slit;
wherein the first coupling slit; and the second coupling slit are in particular aligned in the X-shaped support board assembly.

6. The aircraft light according to claim 1,
wherein the first auxiliary support board comprises first conductive traces, which are electrically coupled to the first electric interface area; and/or
wherein the second auxiliary support board comprises second conductive traces, which are electrically coupled to the second electric interface area.

7. The aircraft light according to claim 1,
wherein the first auxiliary support board comprises a first elastic portion and the first electric interface area is formed on the first elastic portion; and
wherein the second auxiliary support board comprises a second elastic portion and the second electric interface area is formed on the second elastic portion.

8. The aircraft light according to claim 7,
wherein the first auxiliary support board comprises a first auxiliary slit that extends along the first elastic portion, wherein the first coupling slit and the first auxiliary slit in particular form a first slit arrangement that extends around the first elastic portion; and/or
wherein the second auxiliary support board comprises a second auxiliary slit that extends along the second elastic portion, wherein the second coupling slit and the second auxiliary slit in particular form a second slit arrangement that extends around the second elastic portion.

9. The aircraft light according to claim 1,
wherein the opto-electronic component is a light sensor; or
wherein the opto-electronic component is an auxiliary light source, such as a status indicating auxiliary light source.

10. The aircraft light according to claim 1, wherein at least one of aircraft light power circuitry, aircraft light control circuitry, and light sensor output evaluation circuitry is arranged on the first auxiliary support board.

11. The aircraft light according to claim 1, further comprising a support structure for supporting the light source support board, the first auxiliary support board and the second auxiliary support board; wherein the support structure is in particular provided with at least one cooling rib for dissipating heat, which is generated when the aircraft light is operated.

12. The aircraft light according to claim 1,
wherein the aircraft light is an exterior aircraft light, such as an aircraft navigation light or a white strobe anti-collision light or a red-flashing aircraft beacon light or a logo light or a wing scan light or an engine scan light or a cargo loading light or an aircraft headlight, for example an aircraft landing light or an aircraft take-off light or an aircraft taxi light or an aircraft runway turn-off light, or a multi-functional exterior aircraft light, having the functionalities of at least two of an aircraft navigation light, a white strobe anti-collision light, a red-flashing aircraft beacon light, a logo light, a wing scan light, an engine scan light, a cargo loading light, an aircraft landing light, an aircraft take-off light, an aircraft taxi light, and an aircraft runway turn-off light; or
wherein the aircraft light is an interior aircraft light, such as a general cabin illumination light, a signal light, a passenger reading light, a washroom illumination light, an emergency light, or an exit light.

13. An aircraft, in particular an airplane or a helicopter, comprising the at least one aircraft light according to claim 1.

14. A method of assembling an aircraft light, wherein the method includes:
providing a light source support board with at least one light source on a light source side of the light source support board and with a light transmission opening through the light source support board, the light transmission opening extending between the light source side of the light source support board and a back side of the light source support board; and
arranging an X-shaped support board assembly, comprising a first auxiliary support board and a second auxiliary support board, in an electronics accommodation space on the back side of the light source support side;
wherein an opto-electronic component is arranged on the second auxiliary support board and is oriented towards the light transmission opening;
wherein the first auxiliary support board comprises a first electric interface area; wherein the second auxiliary support board comprises a second electric interface area; wherein the first and second electric interface areas are in electrical contact with each other; and wherein at least one of the first electric interface area and the second electric interface area is formed on a first elastic portion.

\* \* \* \* \*